United States Patent
Liang et al.

(10) Patent No.: US 10,338,416 B2
(45) Date of Patent: Jul. 2, 2019

(54) COUPLING-MODULATED OPTICAL RESONATOR

(71) Applicant: Hewlett Packard Enterprise Development LP, Houston, TX (US)

(72) Inventors: Di Liang, Palo Alto, CA (US); David A. Fattal, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/027,096

(22) PCT Filed: Oct. 15, 2013

(86) PCT No.: PCT/US2013/065116
§ 371 (c)(1),
(2) Date: Apr. 4, 2016

(87) PCT Pub. No.: WO2015/057210
PCT Pub. Date: Apr. 23, 2015

(65) Prior Publication Data
US 2016/0238860 A1 Aug. 18, 2016

(51) Int. Cl.
*G02B 6/12* (2006.01)
*G02F 1/025* (2006.01)
(Continued)

(52) U.S. Cl.
CPC ............... *G02F 1/025* (2013.01); *G02B 6/00* (2013.01); *G02B 6/29338* (2013.01);
(Continued)

(58) Field of Classification Search
USPC .................................. 385/2, 8, 14
See application file for complete search history.

(56) References Cited

U.S. PATENT DOCUMENTS 5,544,268 A 8/1996 Bischel et al.
6,819,691 B2 11/2004 Fan
(Continued)

FOREIGN PATENT DOCUMENTS

| CN | 101036076 A | 9/2007 |
| CN | 101593931 B | 12/2009 |
| CN | 101800397 B | 8/2010 |
| CN | 103259190 A | 8/2013 |

OTHER PUBLICATIONS

Bogaerts, W. et al., "Silicon Microring Resonators," Laser & Photonics Reviews 6.1, 2012, pp. 47-73, available at http://pcphotonics.intec.ugent.be/download/pub_3105.pdf.
(Continued)

*Primary Examiner* — Eric Wong
(74) *Attorney, Agent, or Firm* — Hewlett Packard Enterprise Patent Department

(57) ABSTRACT

Coupling modulation of an optical resonator employs a variable modal index to provide modulation of optical signal coupling. A coupling-modulated optical resonator includes an optical resonator having a coupled portion and a bus waveguide having a modulation section adjacent to and coextensive with and separated by a gap from the coupled portion. The modulation section is to modulate coupling of an optical signal between the optical resonator and the bus waveguide according to a variable difference between a modal index of the bus waveguide modulation section and a modal index of the optical resonator coupled portion.

13 Claims, 5 Drawing Sheets

(51) Int. Cl.
| | |
|---|---|
| H01S 5/026 | (2006.01) |
| G02B 6/293 | (2006.01) |
| G02B 6/00 | (2006.01) |
| G02F 1/015 | (2006.01) |

(52) U.S. Cl.
CPC .......... *G02B 6/29395* (2013.01); *H01S 5/026* (2013.01); *G02F 2001/0152* (2013.01); *G02F 2203/15* (2013.01); *H01S 5/0261* (2013.01)

(56) References Cited

U.S. PATENT DOCUMENTS

| | | | |
|---|---|---|---|
| 6,947,632 | B2 | 9/2005 | Fischer |
| 6,947,642 | B2 | 9/2005 | Yamazaki |
| 7,738,527 | B2 | 6/2010 | He |
| 8,610,994 | B1 * | 12/2013 | Lentine ................. G02F 1/0147 359/279 |
| 2002/0081055 | A1 | 6/2002 | Painter et al. |
| 2002/0090160 | A1 | 7/2002 | Lim et al. |
| 2002/0105998 | A1 | 8/2002 | Ksendzov |
| 2003/0072534 | A1 | 4/2003 | Bona et al. |
| 2004/0008942 | A1 | 1/2004 | Scheuer et al. |
| 2004/0227089 | A1 * | 11/2004 | Kolodzey ................. H01S 5/30 250/341.8 |
| 2005/0207464 | A1 | 9/2005 | Blauvelt et al. |
| 2006/0039653 | A1 | 2/2006 | Painter et al. |
| 2006/0072875 | A1 | 4/2006 | Bhagavatula et al. |
| 2006/0198415 | A1 | 9/2006 | Yamazaki |
| 2006/0198416 | A1 | 9/2006 | Yamazaki |
| 2008/0267239 | A1 | 10/2008 | Hall et al. |
| 2009/0028504 | A1 | 1/2009 | Wu et al. |
| 2009/0078963 | A1 * | 3/2009 | Khodja .............. G02B 6/12007 257/189 |
| 2009/0226129 | A1 | 9/2009 | Kuipers et al. |
| 2010/0266232 | A1 | 10/2010 | Lipson et al. |
| 2010/0314027 | A1 | 12/2010 | Blauvelt et al. |
| 2011/0026879 | A1 | 2/2011 | Popovic et al. |
| 2011/0170821 | A1 | 7/2011 | Lipson et al. |
| 2011/0280579 | A1 | 11/2011 | McLaren et al. |
| 2012/0134628 | A1 | 5/2012 | Hoekman et al. |
| 2013/0243383 | A1 | 9/2013 | Agarwal et al. |
| 2013/0322472 | A1 | 12/2013 | Li |
| 2016/0204578 | A1 | 7/2016 | Li et al. |

OTHER PUBLICATIONS

Chin, M. K. et al., "Design and Modeling of Waveguide-Coupled Single-Mode Microring Resonators," Journal of Lightwave Technology 16.8, Aug. 1998, pp. 1433-1446, available at http://www.ee.washington.edu/people/faculty/lin_lih/EE539S06/MRR-JLT1998.pdf.

Dai, D. et al., "Enhancement of the Evanescent Coupling Between III-V/Si Hybrid Microring Laser and Bus Waveguide by Using a Bending Coupler," Asia Communications and Photonics, International Society for Optics and Photonics, 2009, 8 pages, available at http://proceedings.spiedigitallibrary.org/proceeding.aspx?articleid=743539.

Fan, G. et al., "Improved Coupling Technique of Ultracompact Ring Resonators in Silicon-on-insulator Technology," (Research Paper), Applied Optics 51.21, Jul. 12, 2012, pp. 5212-5215, available at https://www.researchgate.net/profile/Guofang_Fan/publication/230515548_Improved_coupling_technique_of_ultracompact_ring_resonators_in_silicon-on-insulator_technology/links/09e415057baec27639000000.pdf.

Gardes. F. Y. et al., "Evolution of Optical Modulation Using Majority Corner Plasma Dispersion Effect in SOI," Silicon Photonics III, Proc. of SPIE, vol. 6898, 2008, 10 pages, available at https://www.researchgate.net/profile/Frederic_Ganges/publication/255654001_Evolution_of_optical_modulation_using_majoity_carrier_plasma_dispersion_effea_in_SOI_-_art_no._68980C/links/54ea6a6a0cf25ba91c832f25.pdf.

International Search Report & Written Opinion received in PCT Application No. PCT/US2013/065116, dated Jul. 4, 2014, 14 pages.

Sacher. W. D. et al., "Characteristics of Microring Resonators With Waveguide-Resonator Coupling Modulation," Lightwave Technology, Journal of 27.17, 2009, pp. 3800-3811, available at http://ieeexplore.ieee.org/xpl/login.jsp?tp=&arnumber=4895258&url=http%3A%2F%2Fieeexplore.ieee.org%2Fxpis%2Fabs_ali.jsp%3Farnumber%3D4895258.

Sacher. W. D. et al., "Dynamics of Mirroring Resonator Modulators," Optics Express 16.20, 2008, pp. 15741-15753, available at https://www.osapublishing.org/oe/abstract.cfm?url=oe-16-20-15741.

Wang, C. Y, et al., "Design and Analysis of Ultra Small Radius Micro-Ring Resonator," SPIE Optics+ Optoelectronics, International Society for Optics and Photonics, 2013, 7 pages.

Yariv, A., "Critical Coupling and its Control in Optical Waveguide-Ring Resonator Systems," IEEE Photonics Technology Letters 14.4, Apr. 2002, pp. 483-465, available at http://citeseerx.ist.psu.edu/viewdoc/download?doi=10.1.1.476.2093&rep=rep1&type=pdf.

Extended European Search Report for EP Application Number: 13895679.2; dated Jul. 26 2017, pp. 7.

Manipatruni, S., et al., Ultra-Low Voltage, Ultra-Small Mode Volume Silicon Microring Modulator, Optics Express, Aug. 16, 2010, pp. 18235-18242.

EP Office Action cited in Appl. No. 13895679.2 dated Nov. 6, 2018; 4 pages.

* cited by examiner

COUPLING-MODULATED OPTICAL RESONATOR

CROSS-REFERENCE TO RELATED APPLICATIONS

N/A

STATEMENT REGARDING FEDERALLY SPONSORED RESEARCH OR DEVELOPMENT

N/A

BACKGROUND

Optical resonators are employed in photonic systems in a wide variety of ways including, but not limited to, in signal modulation, signal detection, signal switching and routing (e.g., on/off switching, add/drop switching, etc.), and even as light sources (e.g., in laser cavities). For example, an optical resonator coupled to a bus waveguide is often used to selectively block passage of optical signals having a particular wavelength, while optical signals at other wavelengths may be passed through the bus waveguide substantially unaffected. In particular, an optical resonator having a resonance corresponding to a first wavelength may selectively couple from the bus waveguide an optical signal with the first wavelength. The selectively coupled optical signal may be absorbed by the optical resonator, for example, and therefore not proceed in the bus waveguide. However, optical signals at other wavelengths may not be coupled from the bus waveguide and thus may be substantially unaffected by the optical resonator. Being substantially unaffected by the optical resonator, these other optical signals may continue to propagate along the bus waveguide. In another example, the optical resonator may selectively couple an optical signal having the first wavelength out of a first coupled bus waveguide and into second coupled bus waveguide, while other optical signals having other wavelengths remain in the first bus waveguide.

In many photonic circuits that employ optical resonators, optical resonator modulation is often useful or even important to the performance of the photonic circuit. In particular, performance of the optical resonator (e.g., resonance wavelength) may be varied in situ to control an input/output (I/O) characteristic of the photonic circuit that employs the optical resonator. Typically, optical resonator modulation is provided by modulating the optical resonator itself. In particular, a length of a cavity or equivalently a resonance wavelength of the optical resonator may be varied to provide the modulation. For example, a resonance wavelength of a ring resonator may be varied by changing or varying a modal index of an optical waveguide that makes up the ring resonator. The modal index may be varied by applying an electric field to a material of the ring resonator optical resonator, for example. However, modulating the resonance wavelength the optical resonator may be difficult to implement, may involve relatively highly energy consumption, and further may exhibit fundamental limitations associated with modulation bandwidth or speed of modulation.

BRIEF DESCRIPTION OF THE DRAWINGS

Various features of examples in accordance with the principles described herein may be more readily understood with reference to the following detailed description taken in conjunction with the accompanying drawings, where like reference numerals designate like structural elements, and in which.

Figure 1A:
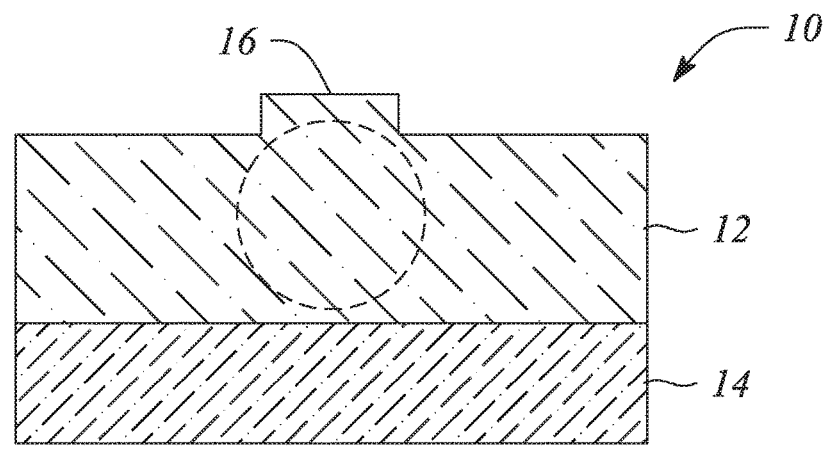
FIG. 1A illustrates a cross sectional view of a ridge-loaded optical waveguide, according to an example consistent with the principles described herein.

Certain examples have other features that are one of in addition to and in lieu of the features illustrated in the above-referenced figures. These and other features are detailed below with reference to the above-referenced figures.

DETAILED DESCRIPTION

Examples in accordance with the principles described herein provide coupling modulation of an optical resonator. In particular, a performance characteristic of a photonic system that employs the optical resonator may be adjusted, tuned or otherwise varied using coupling modulation. According to the principles described herein, coupling modulation varies an amount of optical signal that is coupled one or both of into and out of an optical resonator. Employing coupling modulation as opposed to modulating the optical resonator, for example, may provide lower power consumption, higher modulation speeds and more flexible and simpler layout, design and fabrication of optical resonator based systems, according to various examples consistent with the principles described herein.

As used herein, 'optical waveguide' by definition refers to a waveguide in which a propagating optical signal is confined to and propagates within a slab, sheet or strip of material. As such, a slab optical waveguide or simply a 'slab waveguide' is a slab of material or 'slab layer' that supports a propagating optical signal within the slab layer, by definition herein. According to various examples, the coupling modulation employs an optical waveguide and in some examples a slab optical waveguide. In particular, the optical waveguide may include, but is not limited to, a ridge-loaded optical waveguide, an inverted or reverse ridge-loaded optical waveguide, and a strip optical waveguide. Both the ridge-loaded optical waveguide and the reverse ridge-loaded optical waveguide are slab waveguides while the strip waveguide is not considered a slab waveguide.

In some examples, a transverse dimension (width) of the optical waveguide is selected to preferentially sustain a low-order propagating mode of the optical signal. In some examples, only a single propagating mode is sustained by the optical waveguide. For example, the width may be less than a particular width such that only a first transverse electric mode (i.e., $TE_{10}$) can propagate. The particular width depends on a refractive index of a material of the optical waveguide, the thickness of the optical waveguide layers as well as specific physical characteristics of the optical waveguide (i.e., optical waveguide type). An effective index of refraction experienced by a particular propagating mode is a 'modal index,' by definition herein.

In some examples, a coupling-modulated optical resonator may be fabricated directly in a surface layer (e.g., thin film layer) of a semiconductor substrate. For example, a bus waveguide portion of the coupling-modulated optical resonator may employ various optical waveguides. The optical waveguide(s) may serve as input and output ports of the coupling-modulated optical resonator, for example. Similarly, an optical resonator may also employ an optical waveguide. The optical waveguides may be fabricated in a thin film semiconductor layer of a semiconductor-on-insulator (SOI) substrate (e.g., a silicon or polysilicon thin film layer of a silicon-on-insulator substrate).

FIG. 1A illustrates a cross sectional view of a ridge-loaded optical waveguide 10, according to an example consistent with the principles described herein. The ridge-loaded optical waveguide 10 is also sometimes referred to as a 'ridge-loaded waveguide' or simply a 'ridge waveguide'. The ridge-loaded optical waveguide 10 includes a slab layer 12. The slab layer 12 is or includes a material through which an optical signal propagates and is guided within the ridge-loaded waveguide 10. In particular, the material of the slab layer 12 is substantially transparent to the optical signal and further substantially all of the energy of the optical signal is confined to the slab layer 12 of the ridge-loaded optical waveguide 10, according to various examples. In some examples, the slab layer 12 may include a material such as a semiconductor material, which behaves substantially as a dielectric material with respect to its use in an optical waveguide. In other examples, the slab layer 12 may include more than one semiconductor materials of differing bandgaps and refractive indices.

For example, the slab layer 12 may include a semiconductor material that is compatible with the optical signal such as, but not limited to, silicon (Si), gallium arsenide (GaAs), and lithium niobate ($LiNbO_3$). Any of a single crystalline, polycrystalline or amorphous layer of the semiconductor material may be employed, according to various examples. The transparency of the slab layer material generally affects an optical loss of the ridge-loaded waveguide. For example, the less transparent the material, the more loss is experienced by the optical signal.

In some examples (e.g., as illustrated), the slab layer 12 is supported by a support layer 14. The support layer 14 physically supports the slab layer 12. In some examples, the support layer 14 also facilitates optical confinement in the slab layer 12. In particular, the support layer 14 may include a material that differs from the material of the slab layer 12. In some examples, the support layer 14 may include a material having a refractive index that is less than a refractive index of the slab layer 12. For example, the support layer 14 may be an oxide-based insulator layer (e.g., a silicon oxide of a silicon SOI substrate) and the slab layer 12 may be silicon. In some examples, the different refractive index of the support layer 14 relative to the slab layer 12 serves to substantially confine the optical signal to the slab layer 12 (e.g., by total internal reflection).

The ridge-loaded waveguide 10 further includes a ridge 16. The ridge 16 is located on and extends above a top surface of the slab layer 12. The ridge 16 serves to 'guide' the optical signal within the slab layer 12 directly below the ridge 16. The presence of less material in regions surrounding the ridge 16 (i.e., that defines the ridge 16) reduces a modal index of refraction or modal index experienced by light in a surrounding region relative to the modal index at and in a vicinity of the ridge 16. The reduced modal index causes an optical signal propagating in the slab layer 12 to be 'guided' in the higher modal index due to the presence of the ridge 16. In particular, substantially all of the optical energy of the optical signal tends to be concentrated below but substantially adjacent to the ridge 16 within the slab layer 12. For example, as illustrated in FIG. 1A by a dashed circle, the optical signal guided by the ridge-loaded waveguide 10 may be substantially concentrated in a roughly circular region below the ridge 16. According to various examples, the ridge 16 may be formed by one or more of an etching process, a selective deposition process, a printing process, a combination thereof, or another process. The particular width and height of the ridge 16 are generally a function of a refractive index of the ridge and the underlying slab layer 12 material.

Figure 1B:
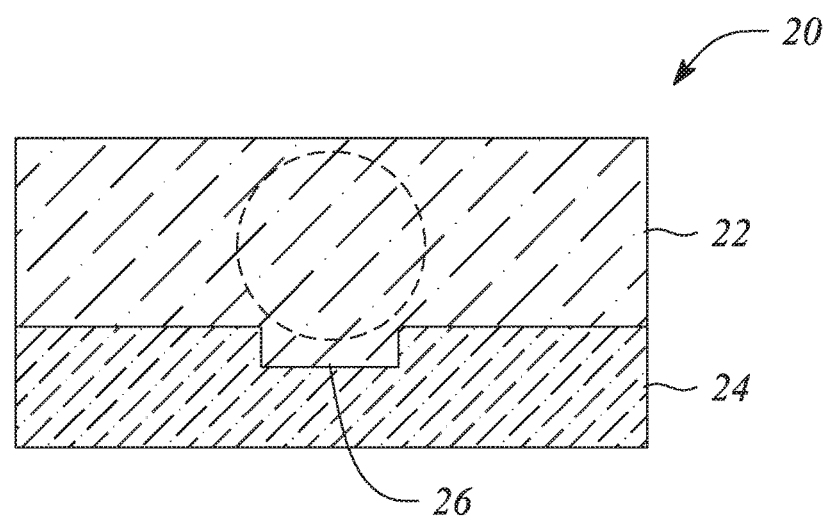
FIG. 1B illustrates a cross sectional view of a reverse ridge-loaded optical waveguide, according to an example consistent with the principles described herein.

FIG. 1B illustrates a cross sectional view of a reverse ridge-loaded optical waveguide 20, according to an example consistent with the principles described herein. The reverse ridge-loaded optical waveguide 20 is also sometimes referred to simply as a 'reverse ridge-loaded waveguide' or a 'reverse ridge waveguide.' As illustrated, the reverse ridge-loaded optical waveguide 20 includes a slab layer 22 and a support layer 24. The support layer 24 includes a material having a refractive index that is less than the refractive index of the slab layer 22. The slab layer 22 may be substantially similar to the slab layer 12 of the ridge-loaded waveguide 10, described above, for example. Further, the support layer 24 may be substantially similar to the support layer 14 of the ridge-loaded waveguide 10, described above.

The reverse ridge-loaded waveguide 20 further includes a ridge 26. The ridge 26 extends from an interface between the support layer 24 and the slab layer 22 into the support layer 24. As such, the ridge 26 of the reverse ridge-loaded waveguide 20 may be referred to as a 'buried' ridge 26. The buried ridge 26 creates a higher modal index in a vicinity of and above the buried ridge 26 relative to a surrounding region of the slab layer 22. The higher modal index tends to confine light (e.g., the optical signal) adjacent to the buried ridge 26. Hence, as with the ridge 16 of the ridge-loaded waveguide 10 described above, the buried ridge 26 of the reverse ridge-loaded waveguide 20 serves to guide the optical signal within the slab layer 22. An example dashed circle above but substantially adjacent to the ridge 26 illustrates an approximate extent of the optical signal energy associated with an optical signal propagating in and guided by the reverse ridge-loaded waveguide 20.

Figure 1C:
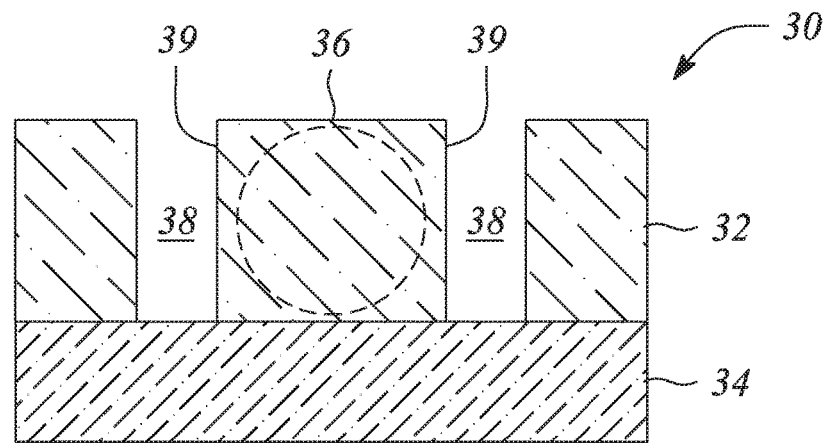
FIG. 1C illustrates a cross sectional view of a strip optical waveguide, according to an example consistent with the principles described herein.

FIG. 1C illustrates a cross sectional view of a strip optical waveguide 30, according to an example consistent with the principles described herein. The strip optical waveguide 30, or simply 'strip waveguide', includes a strip layer 32 and a support layer 34. According to various examples, a refractive index of the support layer 34 is lower than the refractive index of the strip layer 32. The strip optical waveguide 30 further includes a strip 36 formed in or from the strip layer 32. In particular, the strip 36 may be formed in the strip layer 32 by etching channels 38 to define the strip 36. The channels 38 optically isolate the strip 36 from the rest of the strip layer 32. In other examples (not illustrated), the strip 36 is substantially all of the strip layer that remains after fabrication. For example, most of an original strip layer may be removed during fabrication (e.g., by etching) to leave only the strip 36 remaining on the support layer 34. As such, channels are not formed or employed to optically isolate the strip 36, according to some examples.

The optical energy within the strip waveguide 30 is substantially confined to or within the strip 36 by the presence of sidewalls 39 of the strip 36 as well as the presence of the lower refractive index support layer 34 below the strip 36. In particular, a material boundary exists at the sidewalls 39 between a material of the strip layer 32 and air or another dielectric material adjacent thereto, e.g., within the channels 38. Similarly, another material boundary exists between the material of the strip 36 and the lower refractive index support layer 34. These material boundaries surrounding the strip 36 represent a change (i.e., a step decrease) in a refractive index experienced by an optical signal propagating in the strip 36. As a result, the optical signal is tightly bound within the strip 36 (e.g., due to total internal reflection therewithin) due to these material boundaries, according to various examples. A dashed circle within the strip 36 illustrates an approximate extent of the optical energy associated with the optical signal propagating in the strip waveguide 30, for example.

Herein a 'bent optical waveguide' or simply a 'bent waveguide' is defined as an optical waveguide that has a bend or curvature in a plane of propagation. In particular, the bend may result in the bent optical waveguide curving around another optical element such as, but not limited to, an optical resonator. For example, a bus waveguide may include a bent optical waveguide to curve around a portion of a ring resonator in a manner that is substantially conformal to a periphery of the ring resonator. As such, the bent optical waveguide may have a curvature that corresponds to or substantially follows a curvature of the ring resonator. A bent optical waveguide may facilitate increasing a coupling length with the ring resonator, for example.

Further, as used herein, the article 'a' is intended to have its ordinary meaning in the patent arts, namely 'one or more'. For example, 'a waveguide' means one or more waveguides and as such, 'the waveguide' means 'the waveguide(s)' herein. Also, any reference herein to 'top', 'bottom', 'upper', 'lower', 'up', 'down', 'front', 'back', 'left' or 'right' is not intended to be a limitation herein. Herein, the term 'about' when applied to a value generally means within the tolerance range of the equipment used to produce the value, or in some examples, means plus or minus 10%, or plus or minus 5%, or plus or minus 1%, unless otherwise expressly specified. Further, herein the term 'substantially' as used herein means a majority, or almost all, or all, or an amount with a range of about 51% to about 100%, for example. Moreover, examples herein are intended to be illustrative only and are presented for discussion purposes and not by way of limitation.

Figure 2:
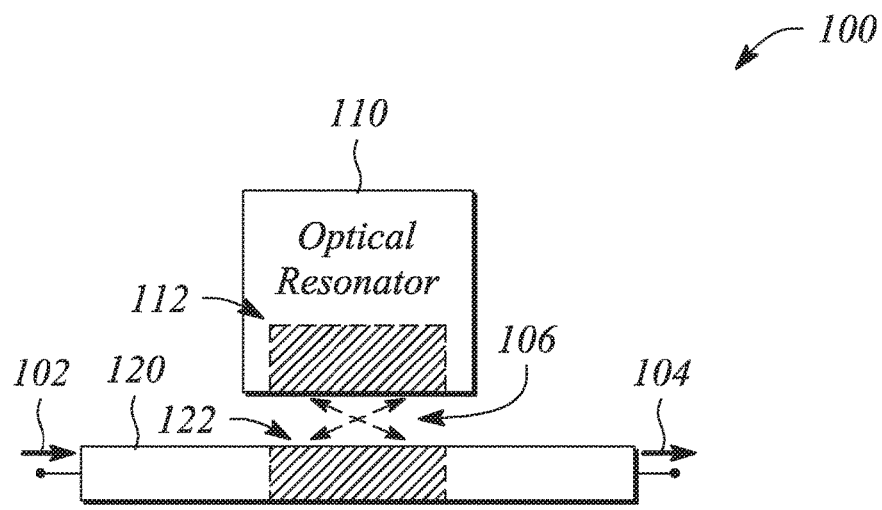
FIG. 2 illustrates a block diagram of a coupling-modulated optical resonator, according to an example of the principles describe herein.

FIG. 2 illustrates a block diagram of a coupling-modulated optical resonator 100, according to an example of the principles describe herein. According to various examples, the coupling-modulated optical resonator 100 may be used to realize one or both of a modulated phase and a modulated amplitude or intensity of an optical signal 102. In particular, the modulation (i.e., of phase or intensity) of the optical signal 102 may be realized with respect to one or both a portion of the optical signal 102 within the coupling-modulated optical resonator 100 and an output optical signal 104 at an output of the coupling-modulated optical resonator 100, for example. According to various examples, modulation of the optical signal 102 is provided by modulation of an optical signal coupling 106 (e.g., of the optical signal 102). Optical signal coupling 106 is illustrated in FIG. 2 by a pair of crossed arrows. The crossed arrows are illustrated using dashed lines to represent the modulation of the optical signal coupling 106, according to various examples.

As illustrated in FIG. 2, the coupling-modulated optical resonator 100 includes an optical resonator 110 having a coupled portion 112. According to some examples, the optical resonator 110 may be a ring resonator 110. In particular, the optical resonator 110 may include a curved (e.g., circular, oval, etc.), ring-shaped optical waveguide that forms an optical cavity. The coupled portion 112 of the ring resonator 110 may be a section or portion of the ring-shaped optical waveguide, for example. The ring resonator 110 may be a so-called 'micro-ring' resonator, for example.

Figure 3A:
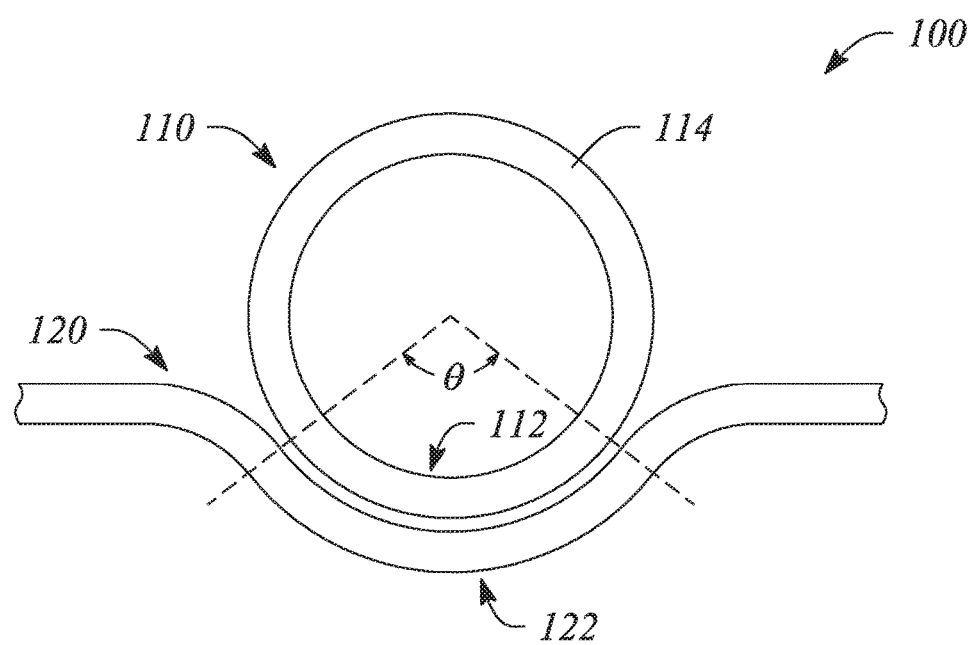
FIG. 3A illustrates a top view of a coupling-modulated optical resonator that includes a ring resonator, according to an example consistent with the principles described herein.

FIG. 3A illustrates a top view of a coupling-modulated optical resonator 100 that includes a ring resonator 110, according to an example consistent with the principles described herein. In particular, as illustrated in FIG. 3A, the ring resonator 110 is a circular ring-shaped optical waveguide 114. For example, the optical waveguide may be a ridge optical waveguide, reverse-ridge optical waveguide or a strip optical waveguide provided on a surface of a substrate. The substrate may be a semiconductor on insulator (SOI) substrate and the optical waveguide may be provided in a semiconductor layer of the SOI surface, for example.

The coupled portion 112 of the ring resonator 110 illustrated in FIG. 3A may include a portion of the ring-shaped optical waveguide 114 and may be characterized or delineated by a so-called 'fan-out' angle θ. As illustrated, a length of the coupled portion 112 is proportional to the fan-out angle θ. According to various examples, an amount or level of optical coupling associated with the coupled portion 112 is determined by the coupled portion length. As such, selection of a particular fan-out angle θ may be used to establish a level of coupling provided by the coupled portion 112, for example.

In some examples, the fan-out angle θ may be greater than about 5 degrees. In particular, the fan-out angle θ may be between about 5 degrees and about 180 degrees. For example, the fan-out angle θ may be between about 5 degrees and about 90 degrees. In another example, the fan-out angle θ may be between about 10 degrees and 60 degrees. In yet other examples, the fan-out angle θ may be between about 20 degrees and about 70 degrees. For example, the fan-out angle θ may range from about 20 degrees to about 40 degrees.

In other examples, the optical resonator 110 may be a racetrack ring resonator 110. The racetrack ring resonator 110 is distinguished from the aforementioned ring resonator 110 (e.g., as illustrated in FIG. 3A) in that the racetrack ring resonator 110 includes at least one substantially straight optical waveguide segment connected by a curved segment of optical waveguide to form a ring. In particular, a racetrack ring resonator 110 is a ring resonator that includes both a curved optical waveguide segment and a substantially straight optical waveguide segment, while acing resonator includes only curved segments, by definition herein. Typically, the racetrack ring resonator 110 includes at least two substantially parallel and straight optical waveguide segments connected together to form a ring by at least two curved (e.g., semi-circular) optical waveguide segments. In some examples, the coupled portion 112 is or includes a portion of a straight optical waveguide segment of the racetrack ring resonator 110. For example, the coupled portion 112 may be an entire length of one of the straight optical waveguide segments.

Figure 3B:
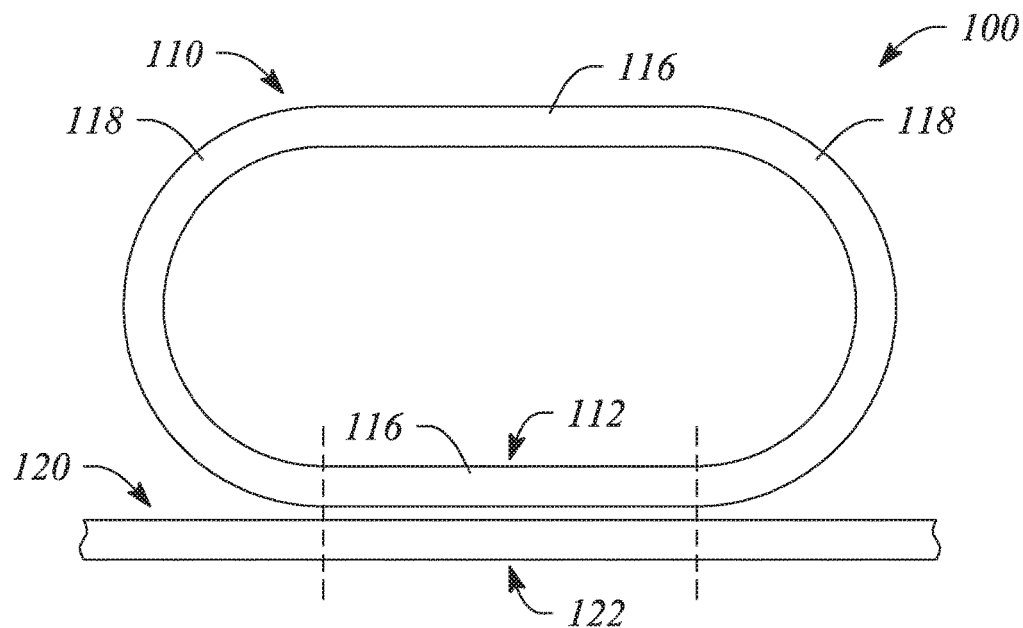
FIG. 3B illustrates a top view of a coupling-modulated optical resonator that includes a racetrack ring resonator, according to an example consistent with the principles described herein.

FIG. 3B illustrates a top view of a coupling-modulated optical resonator 100 that includes a racetrack ring resonator 110, according to an example consistent with the principles described herein. In particular, as illustrated in FIG. 3B, the racetrack ring resonator 110 includes a pair of straight optical waveguide segments 116. The straight optical waveguide segments 116 are interconnected to form a ring by a pair of semicircular optical waveguide segments 118, as illustrated. Further as illustrated, one of the straight optical waveguide segments 116 is the coupled portion 112. In other examples (not illustrated), the coupled portion 112 of the racetrack ring resonator 110 may be or include a portion of the semicircular segments 118.

In yet other examples, the optical resonator 100 may include, but is not limited to, a disk resonator, a ring resonator formed by straight optical waveguide segments interconnected into a ring by a plurality of total internal reflection (TIR) mirrors, and a Fabry-Pérot optical cavity resonator. When the optical resonator 110 is a disk resonator, a region of the disk adjacent to an outside edge may be the coupled portion 112, while a portion of a straight optical waveguide segment may be the coupled portion 112 in either the TIR mirror-based optical resonator 110 or the Fabry-Pérot optical cavity resonator, for example.

Referring again to FIG. 2, the coupling-modulated optical resonator 100 further includes a bus waveguide 120 having a modulation section 122, according to various examples. According to various examples, the bus waveguide 120 is an optical waveguide. For example, the bus waveguide 120 may include an optical waveguide such as, but is not limited to, a strip waveguide, a ridge waveguide and a reverse-ridge waveguide. The modulation section 122 may be a portion of the optical waveguide that is adjacent to and substantially coextensive with the coupled portion 112 of the optical resonator 110. Further, the modulation section 122 is separated by a gap from the coupled portion 112. In particular, the modulation section 122 is a portion of the optical waveguide of the bus waveguide 120 that is spaced apart by the gap from the optical resonator coupled portion 112 (e.g., an optical waveguide of the optical resonator 110) to facilitate optical signal coupling. For example, the optical waveguide of the modulation section 122 may be spaced apart from the optical resonator coupled portion 112 by the gap configured to provide a predetermined amount of coupling through evanescent coupling between the coupled portion 112 and the modulation section 122 of the bus waveguide 120. Further, a length of the modulation section 122 substantially equals a length of the optical resonator coupled portion 112, according to various examples.

FIGS. 3A and 3B illustrate the bus waveguide 120 with the modulation section 122 adjacent to and coextensive with the illustrated optical resonator coupled portion 112. As illustrated in FIGS. 3A and 3B, the modulation section 122 is spaced apart from the coupled portion 112 by a substantially constant width gap along a length of the coupled portion 112. In FIG. 3A, the length of the modulation section 122 is about equal to the coupled portion 112 of the ring resonator 110, (e.g., the coupled portion being delineated by the fan-out angle θ in FIG. 3A). FIG. 3B illustrates the modulation section 122 having a length that is substantially equal to a length of an adjacent straight optical waveguide segment 116 of the racetrack ring resonator 110 depicted in FIG. 3B.

FIG. 3A further illustrates the bus waveguide 120 including a bent waveguide. In particular, the modulation section 122 illustrated in FIG. 3A is a bent waveguide. The bent waveguide of the modulation section 122 has a curvature that corresponds to a curvature of the ring resonator 110 within the coupled portion 112. Further, as illustrated, the bent waveguide of the modulation section 122 is outside an outer radius of the ring resonator 110. For example, the bus waveguide 120 and ring resonator 110 may be substantially coplanar and the bent waveguide of the modulation section 122 may be outside the ring resonator outer radius to provide the gap along the length to the coupled portion 112. In other examples (not illustrated), the bent waveguide of the modulation section may either overlie or underlie the coupled portion 112 of the optical resonator 110 (e.g., a ring or disk optical resonator) and a curvature of the bent waveguide may follow or be substantially coincident with a curve (e.g., of an outside edge) of the optical resonator 110. In some examples, the bent waveguide may increase a length of coupling between the coupled portion 112 and the modulation section 122 when compared to not using the bent waveguide. Moreover, the increased length of coupling provided by the bent waveguide may facilitate using a larger gap for a given predetermined amount of coupling than would be the case without the bent waveguide. The larger gap may reduce manufacturing costs, improve yield, etc., compared to a modulation section 122 coupled to a curved coupled portion 112 without a bent waveguide, according to some examples.

According to various examples, the modulation section 122 of the bus waveguide 120 is configured to modulate coupling of an optical signal 102 between the optical resonator 110 and the bus waveguide 120. In particular, the modulated optical signal coupling 106 is illustrated by dashed, cross arrows in FIG. 2, as noted above. The optical coupling 106 may couple the optical signal 102 by evanescent coupling across the gap between the modulated section 122 and the coupled portion 112. According to various examples, the coupling is modulated according to a variable difference between a modal index of the bus waveguide modulation section 122 and a modal index of the optical resonator coupled portion 112 (e.g., a modal index of an optical waveguide that provides the coupled portion 112).

In particular, coupling of an optical signal between the bus waveguide modulation section 122 and the coupled portion 112 of the optical resonator 110 (e.g., evanescent coupling) may have a first value, level or strength when a modal index $n_b$ of the modulation section 122 of the bus waveguide 120 substantially equals a modal index $n_r$ of the coupled portion 112 of the optical resonator 110 (e.g., $n_r - n_b \approx 0$). Alternatively, when modulation section modal index $n_b$ is not equal to the coupled portion modal index $n_r$ (e.g., $n_r - n_b \neq 0$), optical signal coupling between the bus waveguide modulation section 122 and the optical resonator coupled portion 112 have a second value, level or strength. The first and second values of optical signal coupling may differ substantially for relatively small, non-zero differences between the modal indices of the bus waveguide modulation section 122 and the optical resonator coupled portion 112, according to various examples. In particular, a maximum value of optical signal coupling may be provided by a modal index difference $\Delta n$ (i.e., $\Delta n = n_r - n_b$) that is approximately equal to zero, while a non-zero modal index difference $\Delta n$ may provide optical signal coupling that is less than, and in some examples much less than, the maximum value. For example, a modal index difference $\Delta n$ of between about 0.001 and 0.1 may provide optical signal coupling that is sufficiently below the maximum value to facilitate use of the coupling-modulated optical resonator 100 for various applications. In general, modal index differences $\Delta n$ greater than 0.1 provide even larger differences in optical signal coupling, according to various examples.

Figure 4:
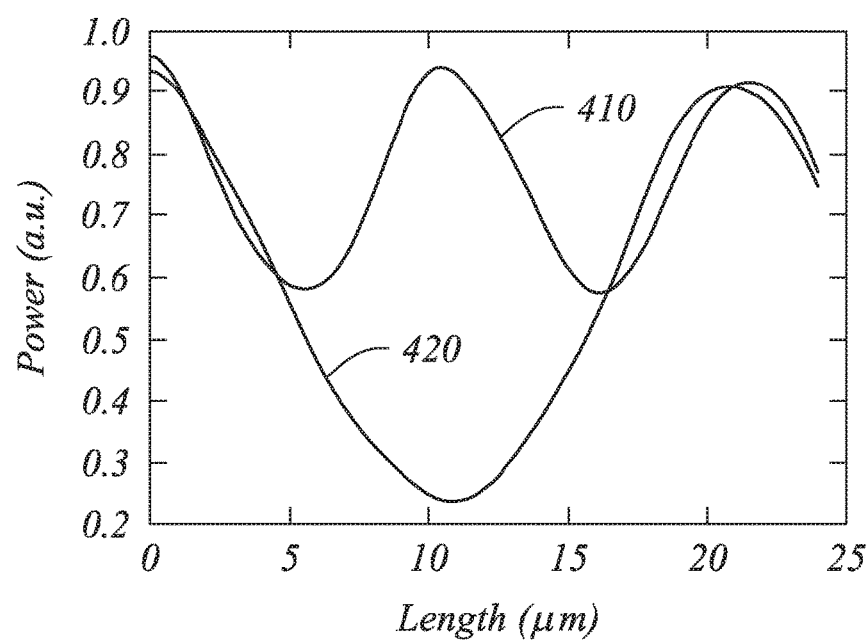
FIG. 4 illustrates a plot of optical signal intensity modulation in an example coupling-modulated optical resonator as a function of coupling length, according to an example consistent with the principles described herein.

FIG. 4 illustrates a plot of optical signal intensity modulation in an example coupling-modulated optical resonator 100 as a function of coupling length, according to an example consistent with the principles described herein. In particular, FIG. 4 illustrates optical signal coupling between a ring resonator 110 and a bus waveguide 120 in terms of coupled power in absorption units (a.u.) as a function of coupling length (i.e., length of the coupled portion 112) in microns ($\mu m$). As illustrated, a first curve 410 represents coupled power for a modal index difference $\Delta n$ equal to zero (0). A second curve 420 illustrated in FIG. 4 represents coupled power as a function of coupling length for a modal index difference $\Delta n$ of about 0.1. In FIG. 4, a maximum value of optical coupling (i.e., about 0.95 a.u.) is achieved at a coupling length of about 11 $\mu m$ with a modal index difference $\Delta n$ of zero (0). However, a modal index difference of 0.1 for the same ring resonator 110 and bus waveguide 120 provides a coupled power of only about 2.5 a.u. for the same coupling length (i.e., about 11 $\mu m$), as illustrated. As such, a relatively large change in the optical signal coupling (i.e., coupled power) may be achieved for a relatively small change in the modal index difference $\Delta n$, according to some examples. The results plotted in FIG. 4 are for a ring resonator 110 and bus waveguide 120 having a bent waveguide modulation section 122 as illustrated in FIG. 3A.

In some examples, the variable modal index difference is provided by a variable modal index of the bus waveguide modulation section 122. In other examples, the variable modal index difference is provided by a variable modal index of the coupled portion 112 of the optical resonator 110. In yet other examples, the variable modal index difference is provided by both a variable modal index of the optical resonator coupled portion 112 and a variable modal index of the bus waveguide modulation section 122. Note that when a variable modal index of the coupled portion 112 is employed to provide the variable modal index difference, the variable modal index is substantially confined to just the coupled portion 112 of the optical resonator 110, by definition herein. In other words, only the modal index of the coupled portion 112 is varied and not a modal index of a portion or substantially all of the optical resonator 110 outside of the coupled portion, according to various examples.

In various examples, the variable modal index of one or both of the coupled portion 112 of the optical resonator 110 and the modulation section 122 of the bus waveguide 120 may be provided using a variety of effects including, but not limited to, an electro-optic effect (e.g., a linear or Pockels electro-optic effect, a quadratic or Kerr/Franz-Keldish electro-optic effect), free carrier plasma dispersion (e.g., by carrier injection, carrier depletion, etc.), heat and various acoustic or mechanical means. For example, a heater may be employed to selectively apply heat to either the coupled portion 112 or the modulation section 122 to change the modal index thereof and produce the variable modal index difference. In another example, free carriers may be either selectively injected into or extracted from an optical waveguide of one or both of the coupled portion 112 and the modulation section 122 to induce a change in the modal index by free carrier plasma dispersion. The free carriers may be selectively injected or extracted using a semiconductor junction (e.g., a p-n junction or p-i-n junction), a quantum well, or a capacitor formed by a dielectric layer adjacent to a semiconductor (e.g., a metal-oxide-semiconductor capacitor or a semiconductor-oxide-semiconductor capacitor) within the optical waveguide, for example. In yet other examples, an electric field (e.g., applied using an electrode) may be used to induce a change in the modal index of one or both of the coupled portion 112 and the modulation section 122 according to one or both of the Pockels electro-optical effect and the Kerr/Franz-Keldish electro-optical effect.

Figure 5A:
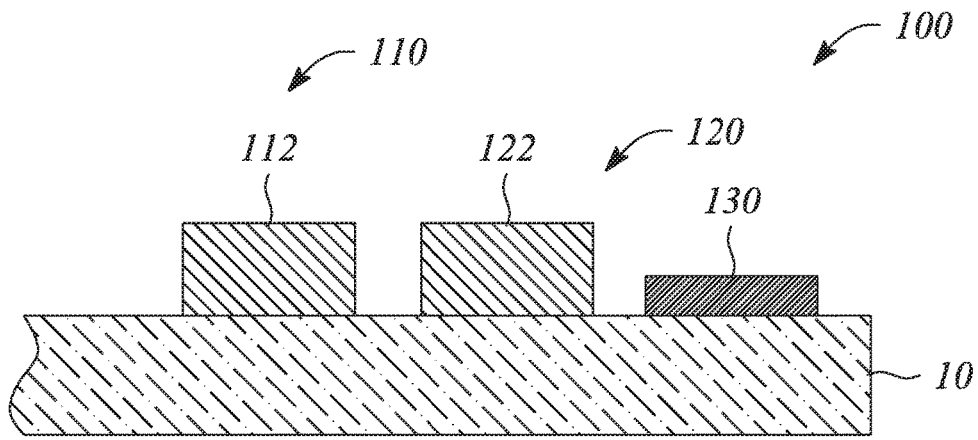
FIG. 5A illustrates a cross sectional view of a portion of a coupling-modulated optical resonator, according to an example consistent with the principles described herein.

FIG. 5A illustrates a cross sectional view of a portion of a coupling-modulated optical resonator 100, according to an example consistent with the principles described herein. In particular, FIG. 5A illustrates a cross section through optical waveguides representing the coupled portion 112 of the optical resonator 110 and the adjacent modulation section 122 of the bus waveguide 120. As illustrated, a heater 130 is provided adjacent to the modulation section 12 to selectively heat the optical waveguide of the modulation section 122. The heat may be used to change a value of the variable modal index of the modulation section 122, for example. In some examples, the heater 130 may be a resistive heating element. The resistive heating element of the heater 130 may be affixed to either a substrate 10 adjacent to the modulation section 122 (e.g., as illustrated) or to a portion of the material layer of the modulation section 122 (e.g., next to the modulation section 122). Alternatively (not illustrated), the heater 130 may be integrated into the substrate 10 or even mounted on a top of an optical waveguide of the modulation section 122, for example.

Figure 5B:
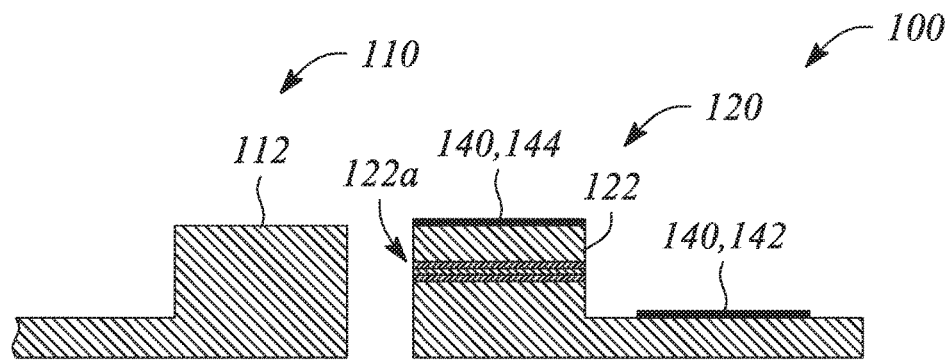
FIG. 5B illustrates a cross sectional view of a portion of a coupling-modulated optical resonator, according to another example consistent with the principles described herein.

FIG. 5B illustrates a cross sectional view of a portion of a coupling-modulated optical resonator 100, according to another example consistent with the principles described herein. As with FIG. 5A, FIG. 5B illustrates a cross section through optical waveguides representing the coupled portion 112 of the optical resonator 110 and the adjacent modulation section 122 of the bus waveguide 120. FIG. 5B further illustrates an electrode 140 connected to the modulation section 122 to vary a concentration of carriers (e.g., free carriers) with the modulation section 122 of the bus waveguide 120. For example, the optical waveguide of the modulation section 122 may include a semiconductor material to provide the free carriers. According to various examples, the variable carrier concentration may result in a variable modal index of the modulation section 122 due to free carrier plasma dispersion.

In particular, as illustrated in FIG. 5B, the optical waveguide of the modulation section 122 includes a quantum well 122a. The electrode 140 is a pair of electrodes that includes an anode 142 and a cathode 144. Application of a voltage across the quantum well 122a using the anode 142 and the cathode 144 may change the free carrier concentration associated with the quantum well 122a to affect a change in the modal index using free carrier plasma dispersion, for example. In another example (not illustrated), the quantum well may be replaced by a diode junction (e.g., a p-n junction or a p-i-n junction) and the electrode pair 140 (i.e., anode 142 and cathode 144) may be used to vary the carrier concentration at the diode junction by either forward biasing or reverse biasing to affect the free carrier plasma dispersion based variation of modal index in the modulation section 122.

Figure 5C:
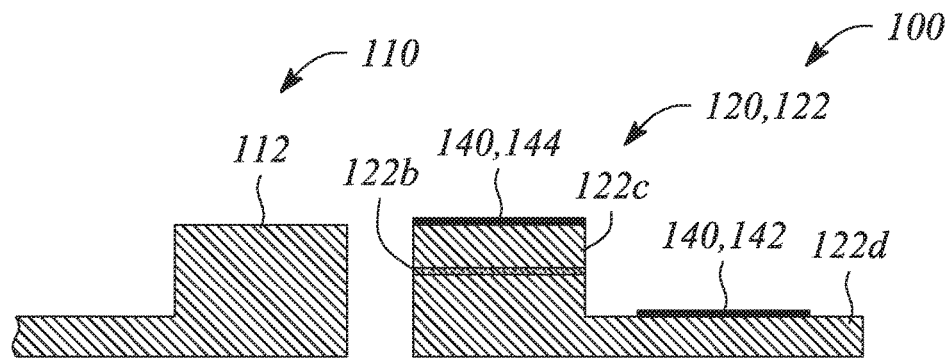
FIG. 5C illustrates a cross sectional view of a portion of a coupling-modulated optical resonator, according to yet another example consistent with the principles described herein.

FIG. 5C illustrates a cross sectional view of a portion of a coupling-modulated optical resonator 100, according to yet another example consistent with the principles described herein. In particular, the modulation section 122 of the bus waveguide 120 illustrated in FIG. 5C includes a dielectric layer 122b sandwiched between a first semiconductor layer 122c and a second semiconductor layer 122d to form a capacitor. The electrode 140 (e.g., as a pair of electrodes) may be used to apply an electric field across the capacitor to vary the modal index using a change in carrier concentration in the semiconductor layers 122c, 122d, for example. Note that a substrate is omitted in FIGS. 5B and 5C for simplicity of illustration and not by way of limitation. In particular, an SOI substrate (not illustrated) may be employed to realize the optical waveguides (e.g., ridge waveguides) of FIGS. 5B and 5C.

Figure 6:
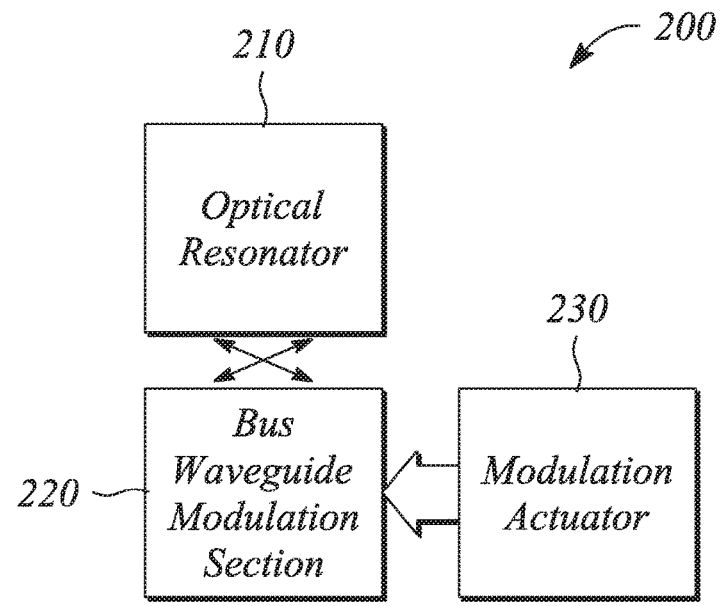
FIG. 6 illustrates a block diagram of a coupling-modulated optical resonator system, according to an example consistent with the principles described herein.

FIG. 6 illustrates a block diagram of a coupling-modulated optical resonator system 200, according to an example consistent with the principles described herein. As illustrated, the coupling-modulated optical resonator system 200 includes an optical resonator 210 having a coupled portion. According to some examples, the optical resonator 210 and coupled portion may be substantially similar to the optical resonator 110 and coupled portion 112 described above with respect to the coupling-modulated optical resonator 100. In particular, the optical resonator 210 may be a ring resonator where a portion of a curved or ring-shaped optical waveguide of the ring resonator corresponds to the coupled portion. In other examples, the optical resonator 210 may be or include, but is not limited to, a racetrack ring resonator a disk resonator, a ring resonator formed by straight optical waveguide segments interconnected into a ring by a plurality of TIR mirrors, and a Fabry-Pérot optical cavity resonator.

The coupling-modulated optical resonator system 200 further includes a modulation section 220 of a bus waveguide. The bus waveguide modulation section 220 is adjacent to and has a length that his coextensive with the coupled portion of the optical resonator 210, according to various examples. Further, the bus waveguide modulation section 220 is spaced apart from the coupled portion of the optical resonator 210 by a space or a gap. In particular, according to some examples, the modulation section 220 of the bus waveguide may be substantially similar to the modulation section 122 of the bus waveguide 120 of the coupling-modulated optical resonator 100, described above. The gap is a physical separation between optical waveguides of the bus waveguide modulation section 220 and the coupled portion of the optical resonator 210 such that coupling is provided by evanescent coupling, according to various examples. In particular, the coupling is provided exclusively by evanescent coupling, in some examples.

In some examples, the bus waveguide modulation section 220 includes a bent waveguide. For example, when the optical resonator 210 is a ring resonator, the bus waveguide modulation section 220 may be a bent waveguide having a curvature corresponding to a curvature of the ring resonator. In various examples, the bus waveguide modulation section 220 of the bus waveguide (and even the bus waveguide itself) may be substantially coplanar with the optical resonator 210 (e.g., an optical waveguide thereof). In other examples, the bus waveguide modulation section 220 may be on a layer either above or below a layer that includes the optical resonator 210. In these examples, the bus waveguide modulation section 220 may either pass over or under the coupled portion of the optical resonator 210, for example.

The coupling-modulated optical resonator system 200 further includes a modulation actuator 230. The modulation actuator 230 is configured to control a modal index of the bus waveguide modulation section 220, according to various examples. Further, the controlled modal index is configured to modulate an optical signal coupling between the optical resonator and the bus waveguide in a vicinity of the coupled portion of the optical resonator 210 and the bus waveguide modulation section 220 (crossed-arrows in FIG. 6). According to various examples, the modulation actuator 230 may include, but is not limited to, a heater and an electrode. The heater and the electrode may be substantially similar to the heater 130 and electrode 140, respectively, described above with respect to the coupling-modulated optical resonator 100. For example, the modulation actuator 230 may include an electrode to control a value of the modal index of the bus waveguide modulation section 20 using free carrier plasma dispersion or another electro-optic effect.

In some examples, the bus waveguide modulation section 220 may include a dielectric layer sandwiched between a first semiconductor layer and a second semiconductor layer to form a capacitor. The electrode of the modulation actuator 230 may be configured to vary the modal index using a change in carrier concentration in the semiconductor layer using an applied electric field, for example. In another example, the bus waveguide modulation section 220 may include a semiconductor junction and the electrode of the bus waveguide modulation actuator 230 may be used to vary the carrier concentration at the semiconductor junction. Similarly, the electrode of the modulation actuator 230 may be used to vary the modal index of the bus waveguide modulation section 220 that includes a quantum well, according to another example, as described above.

Figure 7:
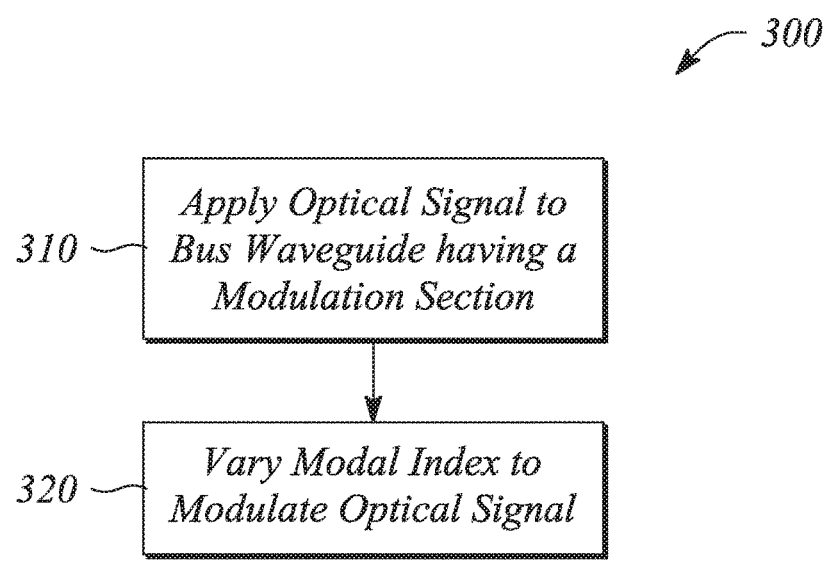
FIG. 7 illustrates a flow chart of a method of optical resonator coupling modulation, according to an example consistent with the principles described herein.

FIG. 7 illustrates a flow chart of a method 300 of optical resonator coupling modulation, according to an example consistent with the principles described herein. The method 300 of optical resonator coupling modulation includes applying 310 an optical signal to a bus waveguide having a modulation section adjacent to and separated by a gap from a coupled portion of an optical resonator. According to various examples, coupling between the modulation section and the optical resonator coupled portion is provided by evanescent coupling across the gap. The bus waveguide and modulation section may be substantially similar to the bus waveguide 120 and modulation section 122 of the coupling-modulated optical resonator 100, described above. For example, the modulation section may include a bent optical waveguide. Similarly, the optical resonator may be substantially similar to the optical resonator 110 and coupled portion 112 described above with respect to the coupling-modulated optical resonator 100. For example, the optical resonator may include, but is not limited to, a ring resonator, a racetrack ring resonator, a disc resonator, etc. The bent optical waveguide of the modulation section may have a curvature corresponding to a curvature of the coupled portion of the ring resonator or the disc resonator, according to some examples.

The method 300 of optical resonator coupling modulation further includes varying 320 a modal index of one or both of the modulation section and the coupled portion of the optical resonator. The modal index is varied 320 to modulate a coupling of the applied optical signal between the bus waveguide and the optical resonator. According to various examples, varying 320 the modal index of the modulation section includes one or more of applying heat to the modulation section, changing a carrier concentration within the modulation section, and employing an electro-optic effect within the modulation section. Varying 320 the modal index of the coupled portion of the optical resonator may include one or more of applying heat to the optical resonator coupled portion, changing a carrier concentration within the optical resonator coupled portion, and employing an electro-optic effect within the optical resonator coupled portion.

For example, the modulation section may include one or both of a diode junction and a quantum well and varying 320 may employ a bias to change the modal index using free carrier plasma dispersion. An electrode associated with the modulation section may provide the bias, for example. According to some examples, the electrode may be substantially similar to the electrode 140 described above with reference to the example coupling-modulated optical resonators 100 illustrated in FIGS. 5A and 5B. Heat may be applied to the modulation section using a heater that is substantially similar to the heater 130 described above with respect to the coupling-modulated optical resonator 100, according to some examples. Similarly, the coupled portion of the optical resonator may include one or both of a diode junction and a quantum well and varying 320 may employ a bias to change the modal index using free carrier plasma dispersion. An electrode may be employed in conjunction with the optical resonator coupled portion to provide the bias. In addition, a heater may be used to apply heat to the optical resonator coupled portion to vary 320 the modal index of the coupled portion.

Thus, there have been described examples of a coupling-modulated optical resonator, a coupling-modulated optical resonator system, and a method of optical resonator coupling modulation that employ a variable modal index to provide modulation of optical signal coupling. It should be understood that the above-described examples are merely illustrative of some of the many specific examples that represent the principles described herein. Clearly, those skilled in the art can readily devise numerous other arrangements without departing from the scope as defined by the following claims.

What is claimed is:

1. A coupling-modulated optical resonator comprising:
an optical resonator having a coupled portion; and
a bus waveguide comprising a modulation section that is separated from the coupled portion of the optical resonator by a gap wherein the modulation section and the coupled portion are adjacent and coplanar, the bus waveguide configured to form an input/output (I/O) port of the optical resonator and route an optical signal through the coupling-modulated optical resonator;
the modulation section comprising a pair of electrodes and a quantum well to modulate coupling of the optical signal between the coupled portion of the optical resonator and the modulation section of the bus waveguide by application of voltage across the quantum well using an anode and a cathode of the pair of electrodes to affect a change in a value of the variable modal index of the optical signal between the coupled portion of the optical resonator and the modulation section of the bus waveguide using free carrier plasma dispersion.

2. The coupling-modulated optical resonator of claim 1, wherein the optical resonator is a ring resonator and the bus waveguide is a bent bus waveguide having a curvature within the modulation section that corresponds to a curvature of the ring resonator within the coupled portion.

3. The coupling-modulated optical resonator of claim 2, wherein the modulation section of the bent bus waveguide and the coupled portion of the ring resonator are coplanar, the modulation section being outside an outer radius of the ring resonator, the coupled portion having a fan-out angle of greater than 5 degrees.

4. The coupling-modulated optical resonator of claim 1, wherein the optical resonator is a racetrack ring resonator, the coupled portion comprising a portion of a straight section of the racetrack ring resonator.

5. The coupling-modulated optical resonator of claim 1, wherein the modulation section of the bus waveguide comprises a variable modal index, the variable modal index to provide the variable difference between the modal index of the bus waveguide modulation section and the modal index of the optical resonator coupled portion.

6. The coupling-modulated optical resonator of claim 5, further comprising a heater to heat the modulation section of the bus waveguide, the heat to change a value of the variable modal index.

7. The coupling-modulated optical resonator of claim 5, further comprising an electrode connected to the modulation section of the bus waveguide to vary a concentration of carriers within the modulation section of the bus waveguide, wherein the variable modal index is a result of free carrier plasma dispersion due to the variable carrier concentration.

8. A coupling-modulated optical resonator system comprising:
an optical resonator having a coupled portion;
a modulation section of a bus waveguide that is separated from the coupled portion of the optical resonator by a gap, wherein the modulation section and the coupled portion are adjacent and coplanar, the bus waveguide configured to form an input/output (I/O) port of the optical resonator and route an optical signal through the coupling-modulated optical resonator; and
a modulation actuator comprising a pair of electrodes and a quantum well to control a modal index of the modulation section by application of voltage across the quantum well using an anode and a cathode of the pair of electrodes to affect a change in a value of the variable modal index of the optical signal between the coupled portion of the optical resonator and the modulation section of the bus waveguide using free carrier plasma dispersion, the controlled modal index to modulate the optical signal coupling between the coupled portion of the optical resonator and the modulation section of the bus waveguide in a vicinity of the coupled portion and the modulation section.

9. The coupling-modulated optical resonator of claim 8, wherein the optical resonator comprises a ring resonator, and wherein the modulation section is a bent waveguide having a curvature corresponding to a curvature of the ring resonator.

10. The coupling-modulated optical resonator of claim 8, wherein the modulation section comprises a dielectric layer sandwiched between a first semiconductor layer and a second semiconductor layer to form a capacitor, the electrode to vary the modal index using a change in carrier concentration in the semiconductor layers.

11. A method of optical resonator coupling modulation, the method comprising:
applying an optical signal to a bus waveguide having a modulation section adjacent to, coextensive with, coplanar with, and separated by a gap from a coupled portion of an optical resonator, the bus waveguide configured to form an input/output (I/O) port of the optical resonator and route the optical signal; and varying a modal index of both the modulation section of the bus waveguide and the coupled portion of the optical resonator to modulate a coupling of the applied optical signal between the bus waveguide and the optical resonator by application of voltage across a quantum well using an anode and a cathode of a pair of electrodes, to affect a change in a value of the modal index of the optical signal between the optical resonator and the bus waveguide using free carrier plasma dispersion, wherein the coupling between the bus waveguide and the optical resonator is provided by evanescent coupling across the gap between the modulation section and the coupled portion.

12. The method of optical resonator coupling modulation of claim 11, wherein the optical resonator comprises a ring resonator and the modulation section comprises a bent optical waveguide having a curvature corresponding to a curvature of the ring resonator.

13. The method of optical resonator coupling modulation of claim 11, wherein varying the modal index of the modulation section includes applying heat to the modulation section, changing a carrier concentration within the modulation section, and employing an electro-optic effect within the modulation section.

* * * * *